(12) United States Patent  
Choy et al.

(10) Patent No.: US 8,256,103 B2  
(45) Date of Patent: Sep. 4, 2012

(54) ACTUATOR FOR MAINTAINING ALIGNMENT OF DIE DETACHMENT TOOLS

(75) Inventors: Ping Kong Choy, Kwai Chung (HK); Chung Sheung Yung, Kwai Chung (HK); Hon Yu Ng, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 404 days.

(21) Appl. No.: 12/718,077

(22) Filed: Mar. 5, 2010

(65) Prior Publication Data  
US 2011/0214282 A1 Sep. 8, 2011

(51) Int. Cl.  
B23P 19/00 (2006.01)

(52) U.S. Cl. .............. 29/762; 29/564.1; 29/743

(58) Field of Classification Search .......... 29/762, 29/426.1, 564.1, 740, 743, DIG. 44; 414/627, 414/744.2, 744.3, 749.1, 751.1, 800, 802, 414/935  
See application file for complete search history.

(56) References Cited

U.S. PATENT DOCUMENTS

| 6,494,667 | B1 * | 12/2002 | Suzuki et al. ............. 414/751.1 |
| 2005/0045914 | A1 * | 3/2005 | Agranat et al. ............. 257/200 |
| 2010/0166535 | A1 * | 7/2010 | Chen et al. ................. 414/749.1 |

* cited by examiner

Primary Examiner — Thiem Phan  
(74) Attorney, Agent, or Firm — Ostrolenk Faber LLP

(57) ABSTRACT

A die detachment apparatus for detaching a die from an adhesive tape on which the die is mounted includes a pick-and-place tool movable along a pick-up axis for picking up the die from the adhesive tape and a die ejector comprising an ejector shaft including an ejector pin. The ejector pin is movable parallel to the pick-up axis to raise the die from the adhesive tape to facilitate pick-up of the die by the pick-and-place tool. At least one movable table to which the ejector shaft is operatively coupled is actuable by at least one piezoelectric actuator which is connected to the movable table via a flexure. Actuation by the piezoelectric actuator forces the movable table and ejector shaft to move in directions which are perpendicular to the pick-up axis for alignment of the ejector pin with the die pick-up tool along the pick-up axis.

17 Claims, 5 Drawing Sheets

ACTUATOR FOR MAINTAINING ALIGNMENT OF DIE DETACHMENT TOOLS

FIELD OF THE INVENTION

The present invention relates to a pick-and-place tool of a bonding apparatus, and in particular to a bonding apparatus for picking up electronic devices from one location and bonding them at another location.

BACKGROUND AND PRIOR ART

Generally, arrays of electronic devices such as semiconductor dice are held securely in position on adhesive surfaces such as adhesive tapes when they are being singulated from a sheet of wafer. After singulation, the adhesive tape holding the dice can be moved on an XY plane by a wafer table to position each die for detachment from the adhesive tape.

To detach a die from the adhesive tape, vacuum force is applied on a non-adhesive side of the tape. The die is partially detached from the adhesive tape as a result of the said vacuum force on the tape. Thus, the area of contact between the tape and the die is reduced. Additionally, an ejector pin below the adhesive tape pushes the die upwards from the non-adhesive side of the tape to lift and further detach the die from the tape. The die can usually be removed completely thereafter by a pick-and-place tool such as a collet mounted to a bond arm of a die bonder when the collet applies a vacuum suction force to hold onto on the detached die and lifts it away from the adhesive tape.

Conventionally, pick-and-place die bonders comprise single bond arms for picking up semiconductor dice. As the size of a die decreases and the number of dice per wafer increases, two or more bond arms can be used to increase throughput, which is calculated in units per hour (UPH). For instance, Japanese publication number 63-100737 entitled "Die Bonding Process" discloses a bonding apparatus including four rotary bonding arms. Each bonding arm has a bonding tool at one end which is at a fixed radial distance from the center of rotation and at equidistance from one another. Therefore, one bonding arm may pick up a die at one location when another bonding arm is bonding a die at another location, resulting in a decrease in bonding cycle time.

However, this approach may bring about problems relating to the difficulty of maintaining a common pick-up point during die detachment. For example, the alignment of the collet on each bond arm to the wafer and the ejector pin is dependent on a distance between the center of rotation of the bond arm and the collet, and requires close monitoring and adjustment. Thermal expansion of the bond arms during the pick-and-place process is one factor that would affect the alignment between the collet and the ejector pin. Therefore, it would be desirable to devise an actuator for automatically aligning the ejector pin with the collet at all times at the pick-up point.

SUMMARY OF THE INVENTION

It is thus an object of the invention to seek to provide an actuator which automatically aligns a die detachment tool to a bonding tool on each bond arm of a bonding apparatus accurately for the purpose of die detachment and die pick-up from an adhesive tape.

According to a first aspect of the invention, there is provided a die ejector for a die detachment apparatus for detaching a die from an adhesive tape on which the die is mounted, the die detachment apparatus including a pick-and-place tool movable along a pick-up axis for picking up the die from the adhesive tape, the die ejector comprising: an ejector shaft including an ejector pin which is movable parallel to the pick-up axis to raise the die from the adhesive tape on which the die is mounted to facilitate pick-up of the die from the adhesive tape by the pick-and-place tool; a positioning device having at least one movable table to which the ejector shaft is operatively coupled, the positioning device further comprising at least one piezoelectric actuator; and at least one flexure connecting the piezoelectric actuator and the movable table, the flexure being operatively responsive to actuation by the piezoelectric actuator to force the movable table and ejector shaft to move in directions which are perpendicular to the pick-up axis for alignment of the ejector pin with the die pick-up tool along the pick-up axis.

According to a second aspect of the invention, there is provided a die detachment apparatus for detaching a die from an adhesive tape on which the die is mounted, comprising: a pick-and-place tool movable along a pick-up axis for picking up the die from the adhesive tape; an ejector shaft including an ejector pin which is movable parallel to the pick-up axis to raise the die from the adhesive tape on which the die is mounted to facilitate pick-up of the die from the adhesive tape by the pick-and-place tool; a positioning device having at least one movable table to which the ejector shaft is operatively coupled, the positioning device further comprising at least one piezoelectric actuator; and at least one flexure connecting the piezoelectric actuator and the movable table, the flexure being operatively responsive to actuation by the piezoelectric actuator to force the movable table and ejector shaft to move in directions which are perpendicular to the pick-up axis for alignment of the ejector pin with the die pick-up tool along the pick-up axis.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
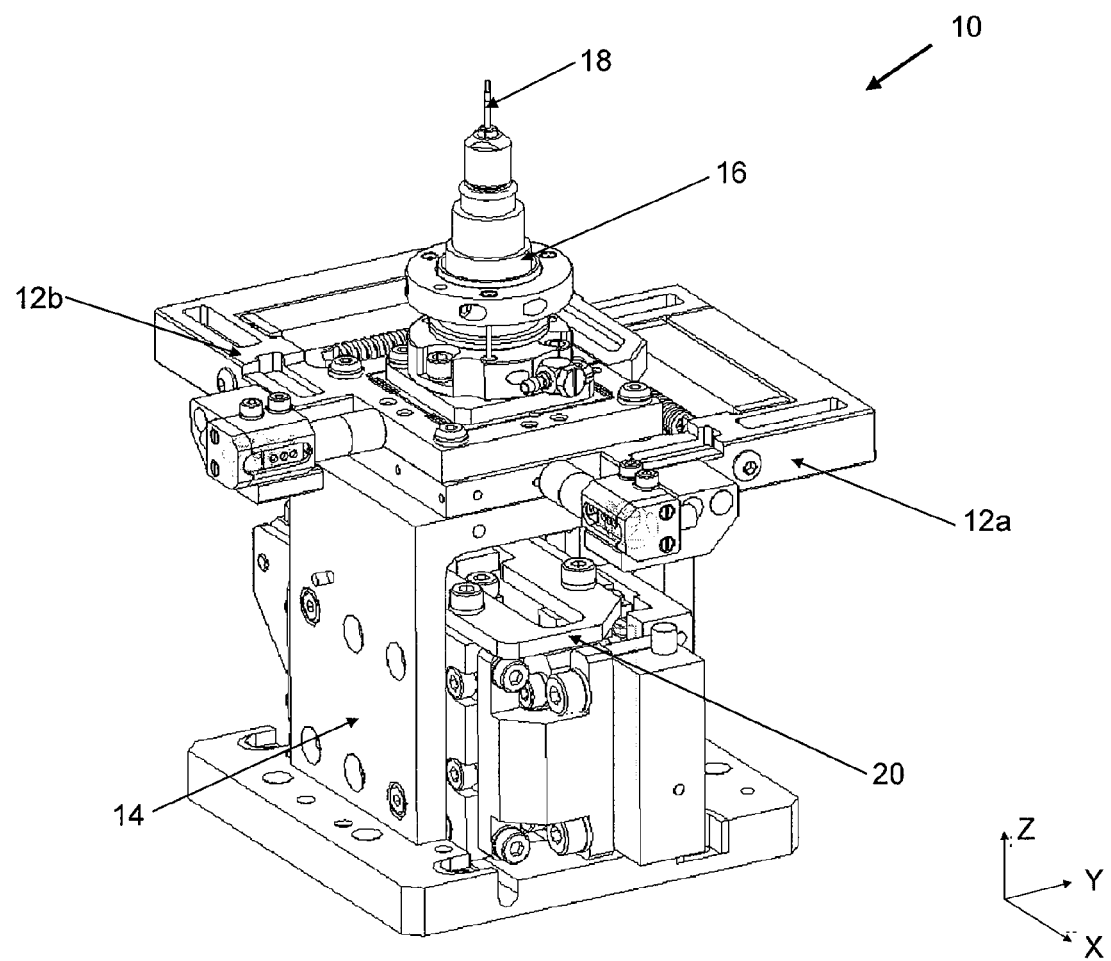
FIG. 1 is an isometric view of a die detachment apparatus according to the preferred embodiment of the invention.

FIG. 1 is an isometric view of a die detachment apparatus 10 according to the preferred embodiment of the invention. The die detachment apparatus 10 comprises a common support frame 14 to which a positioning device comprising one or more flexural stages 12 may be mounted. FIG. 1 illustrates first and second flexural stages 12a, 12b which are arranged orthogonally with respect to each other. The flexural stages 12a, 12b are operative to adjust the position of a die ejector 16 comprising an ejector shaft 17 (see FIG. 4) and an ejector pin 18 mounted thereon along orthogonal X and Y directions respectively. A pick-and-place tool is located over the ejector pin 18 and is movable along a pick-up axis in the Z direction to pick up a die detached from an adhesive tape by the ejector pin 18 during die detachment.

The ejector shaft 17 is operatively coupled to the first and second flexural stages 12a, 12b. In the preferred embodiment, the first flexural stage 12a is operative to move the ejector shaft 17 along a first axis or the X-axis and the second flexural stage 12b is located adjacent to the first flexural stage 12a and is operative to move the ejector shaft 17 along a second axis or the Y-axis. The flexural stages 12a, 12b cooperate to position the ejector shaft 17 and ejector pin 18 in directions which are perpendicular to the pick-up axis for aligning the ejector pin with the pick-and-place tool along the pick-up axis.

The ejector pin 18 is movable parallel to the pick-up axis of the pick-and-place tool in order to raise a die from the adhesive tape on which the die is mounted to facilitate die pick-up. An ejection actuator 20 which is decoupled from the first and second flexural stages 12a, 12b, controls the movement of the ejector shaft 17 and ejector pin 18 parallel to the pick-up axis in a vertical Z direction without moving the die ejector 16 in the X and Y directions. The ejector pin 18 pushes on the adhesive tape to raise the die mounted on the adhesive tape when the ejection actuator 20 is activated to push the die ejector 16 upwards.

Figure 2:
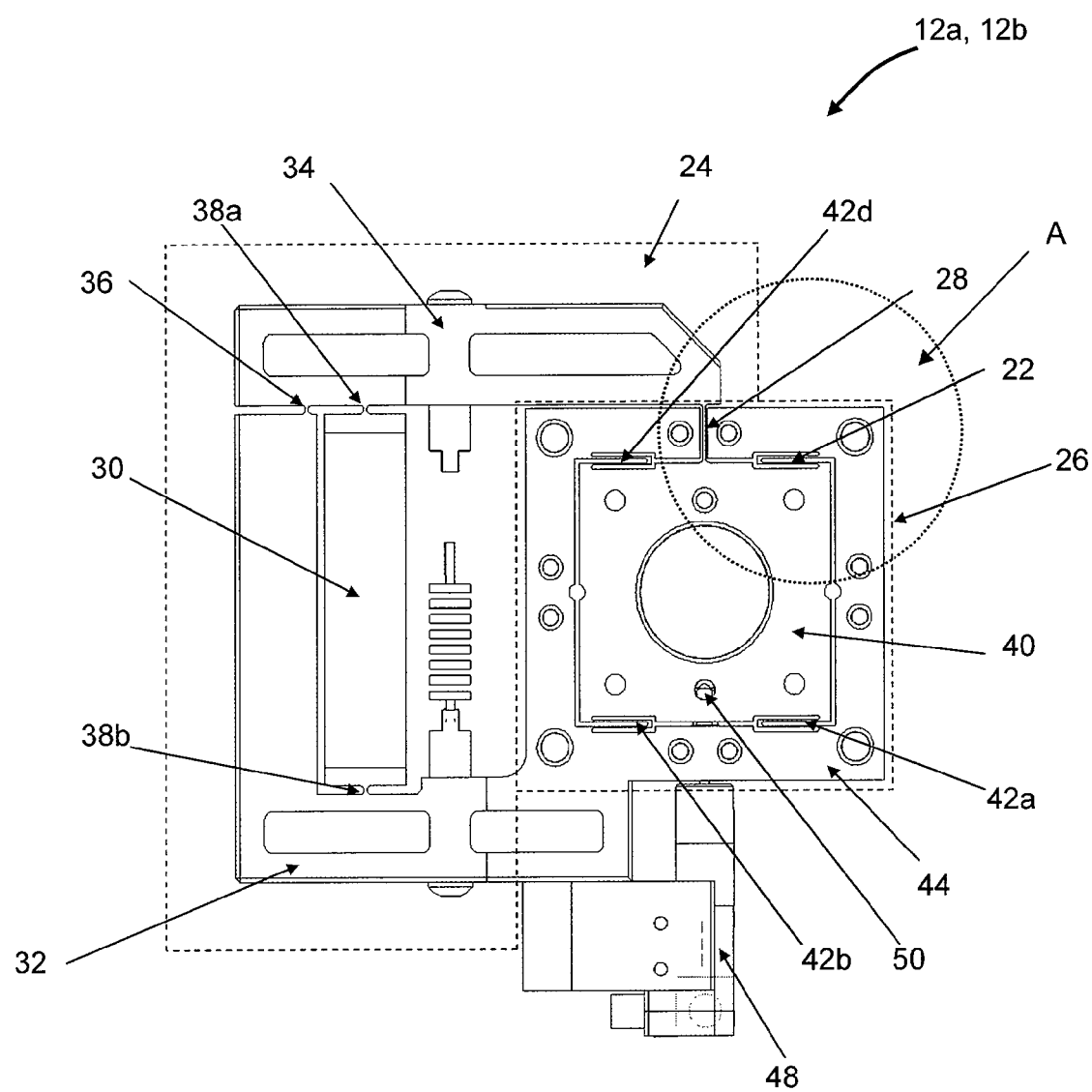
FIG. 2 is a plan view of a flexural stage incorporated in the die detachment apparatus of FIG. 1.

FIG. 2 is a plan view of a flexural stage 12a, 12b incorporated in the die detachment apparatus 10 of FIG. 1. Each flexural stage 12a, 12b may comprise a flexure-based steel structure with a high yield strength and may be machined using wire-cutting. The flexural stages 12a, 12b have two functional regions, namely an amplification region 24 and a flexural guide region 26 which are linked by a flexural beam 28.

The amplification region 24 includes a multilayer piezoelectric actuator which may be in the form of a piezoelectric stack 30, a first stationary frame 32 and a lever 34. The lever 34 is connected to a pivot flexure 36, an input flexure 38a and the flexural beam 28. The input flexure 38a is located between the pivot flexure 36 and the flexural beam 28. The distance between the input flexure 38a and the pivot flexure 36 is less than the distance between the flexural beam 28 and the pivot flexure 36 such that the lever 34 amplifies the displacement output from the multilayer piezoelectric stack 30.

The first stationary frame 32 in the amplification region 24 is an L-shaped structure to which the multilayer piezoelectric stack 30 and the lever 34 are connected. The multilayer piezoelectric stack 30 is arranged parallel to the longer side of the first stationary frame 32 while the lever 34 is orthogonal to the multilayer piezoelectric stack 30 and the longer side of the first stationary frame 32. One end of the multilayer piezoelectric stack 30 is connected to the shorter side of the first stationary frame 32 via an input flexure 38b. The opposite end of the multilayer piezoelectric stack 30 is connected by the input flexure 38a to the lever 34. The pivot flexure 36 is connected between the lever 34 and one end of the longer side of the first stationary frame 32. The flexural beam 28 next to the lever 34 is extended to join the flexural guide region 26 so as to transmit the output displacement of the lever 34 to the flexural guide region 26.

The flexural guide region 26 comprises a movable table 40, flexural guides 42a-42d and a second stationary frame 44. The second stationary frame 44 in the flexural guide region 26 is a rectangular block with a hollow center and it forms a frame around the rectangular movable table 40 which is located in the hollow center. Each movable table 40 has an opening through which the ejector shaft 17 is inserted for operatively coupling the same, so that the movable tables 40 of the first and second flexural stages 12a, 12b drive the ejector shaft 17 in orthogonal directions to align the ejector pin 18 with the pick-up tool. The four flexural guides 42a-42d are arranged adjacent to the four corners of the movable table 40, and they connect the movable table 40 to multiple points on the second stationary frame 44 such that the flexural guides 42a-42d are symmetrically located about the Z axis of the movable table 40.

Additionally, there may be at least one displacement sensor in each of the flexural stages 12a, 12b to provide feedback on the position of the first and second movable tables 40a, 40b relative to the first and second stationary frames 32, 44. The displacement sensor may be a Linear Variable Differential Transformer (LVDT), a capacitor sensor or a scale with a measuring resolution smaller than 0.5 μm. In the preferred embodiment, a LVDT sensor is used which comprises excitable electrical coils 48 mounted to the first stationary frame 32 and a magnetic rod 50 mounted to the movable table 40. Alternatively, the electrical coils 48 may be mounted on the movable table 40 and the magnetic rod 50 may be mounted on the first stationary frame 32.

Figure 3:
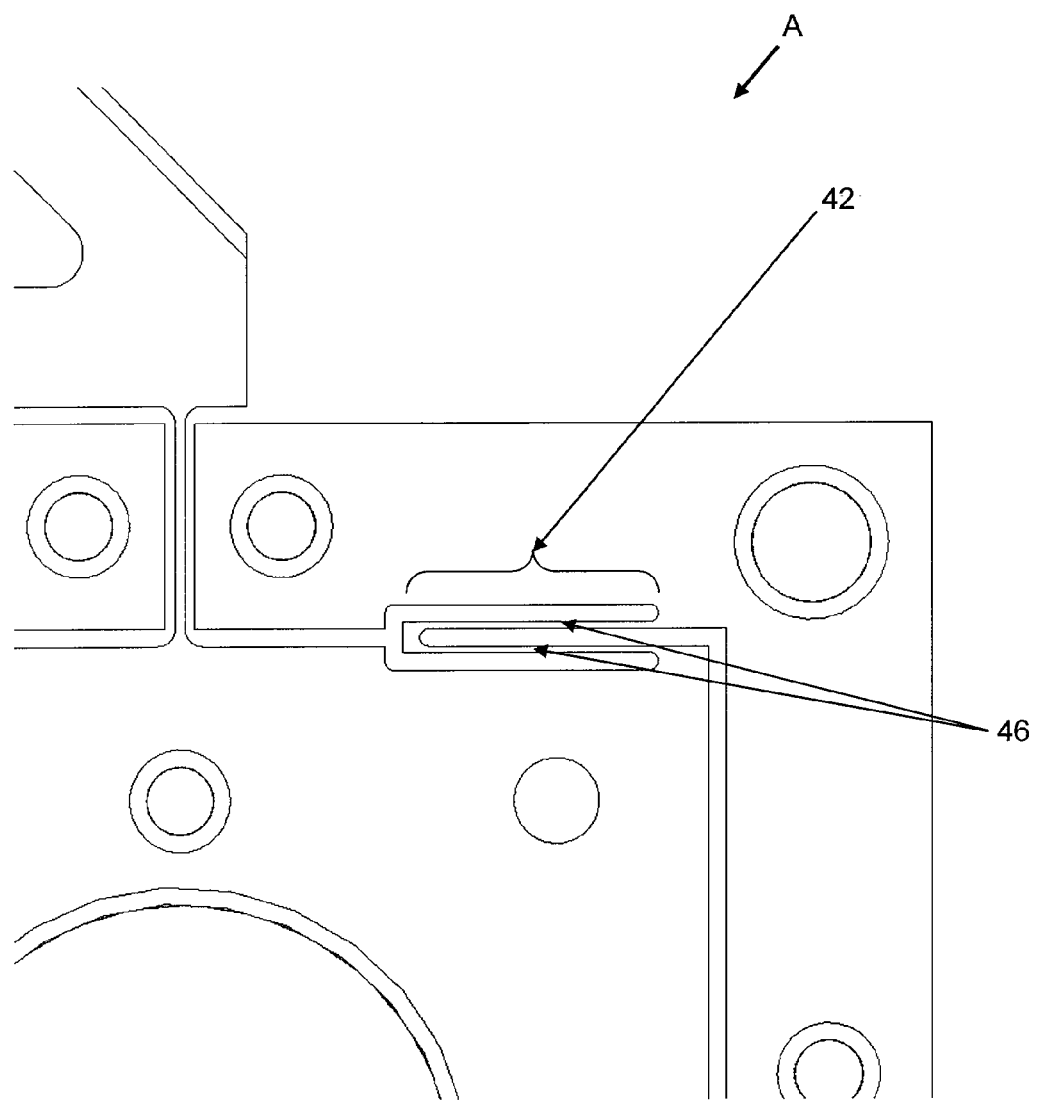
FIG. 3 is an enlarged view of portion A of the flexural stage as indicated in FIG. 2.

FIG. 3 is an enlarged view of portion A of the flexural stage 12a, 12b as indicated in FIG. 2. Each flexural guide 42 comprises a pair of thin parallel beams 46 with one end of each parallel beam connected to the other. The dimensions of the parallel beams 46 are designed to have higher compliance along the axis in which the movable table 40 moves. The length to width ratio is preferably in the range of between 25-50 mm and a depth of between 5-15 mm to enhance the stiffness anisotropy of the flexural guide 42 in different directions.

The operation of the flexural stage 12 is described hereafter with reference to FIGS. 2 and 3. When the multilayer piezoelectric stack 30 of the flexural stage 12 is energized, it elongates and pushes the lever 34. The lever 34 in turn pulls the movable table 40 via the flexural beam 28 which is guided by the flexural guides 42a-42d. In the preferred embodiment, the movable table 40 is movable through a distance of about 150 μm within a period of 20 ms relative to the second stationary frame 44.

As described above, the die detachment apparatus 10 incorporates the first and second flexural stages 12a, 12b arranged orthogonally to each other. The first flexural stage 12a is located on top of the common support frame 14 and moves the die ejector 16 in the X-direction. The second flexural stage 12b is arranged on top of the first movable table 40a of the first flexural stage 12a and moves the die ejector 16 in the Y-direction. The die ejector 16 is fixed to the second movable table 40b of the second flexural stage 12b. The ejector pin 18 is located on the ejector shaft 17 within the die ejector 16 and extends upwards from the die ejector 16.

Figure 4:
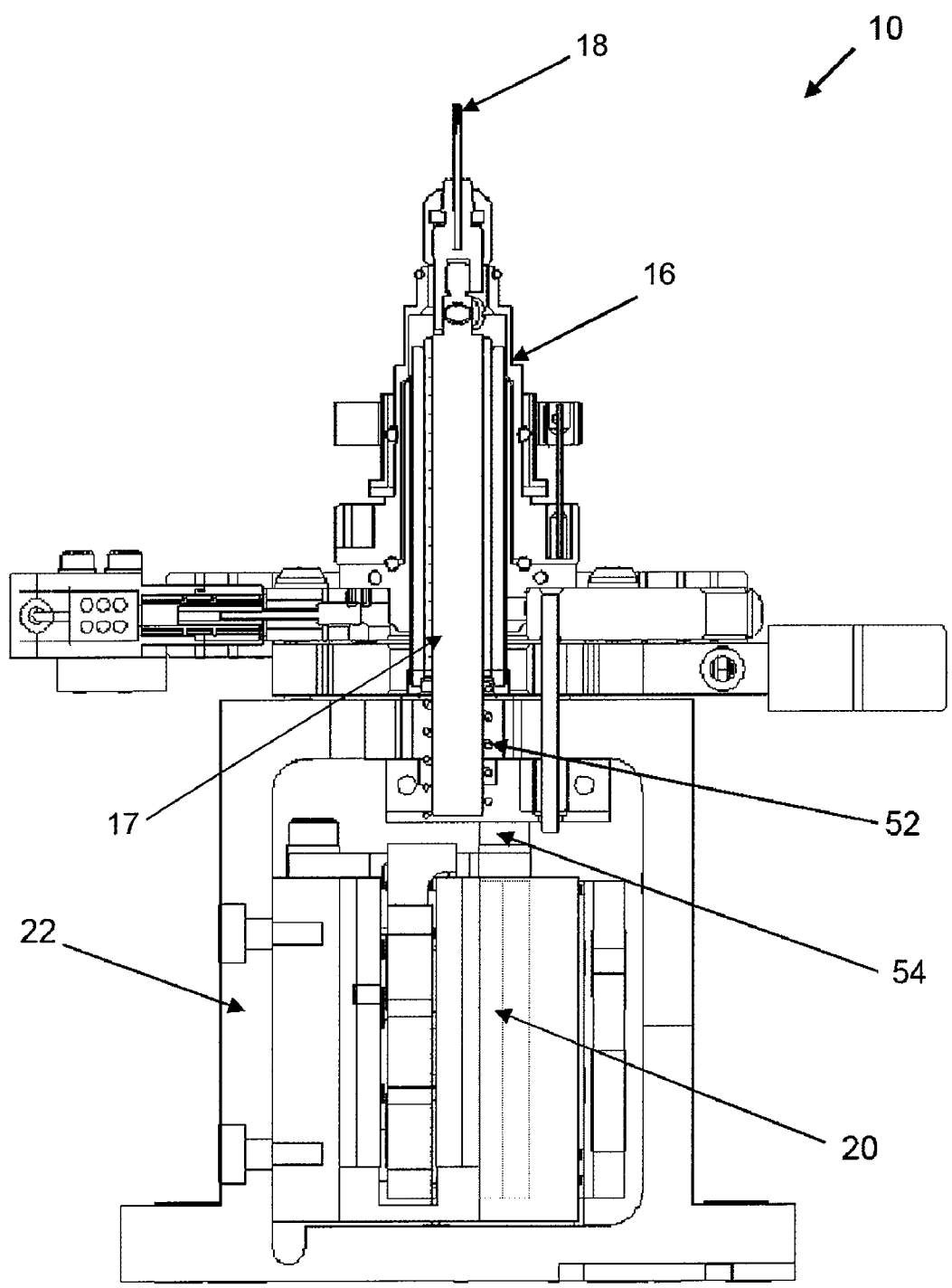
FIG. 4 is a cross-sectional view of the die detachment apparatus of FIG. 1.

FIG. 4 is a cross-sectional view of the die detachment apparatus 10 of FIG. 1. The die ejector 16 is preloaded at its base using a preload spring 52 which contacts a movable unit 54 of the Z actuator 20. Therefore, the Z actuator 20 is decoupled from the flexural stages 12a, 12b. This design has the advantage that when the Z actuator 20 is actuated and moves the ejector shaft 17 and the ejector pin 18 vertically in the Z direction, the flexural stages 12 are not actuated correspondingly to shift the ejector pin 18 in the X or Y directions.

Figure 5:
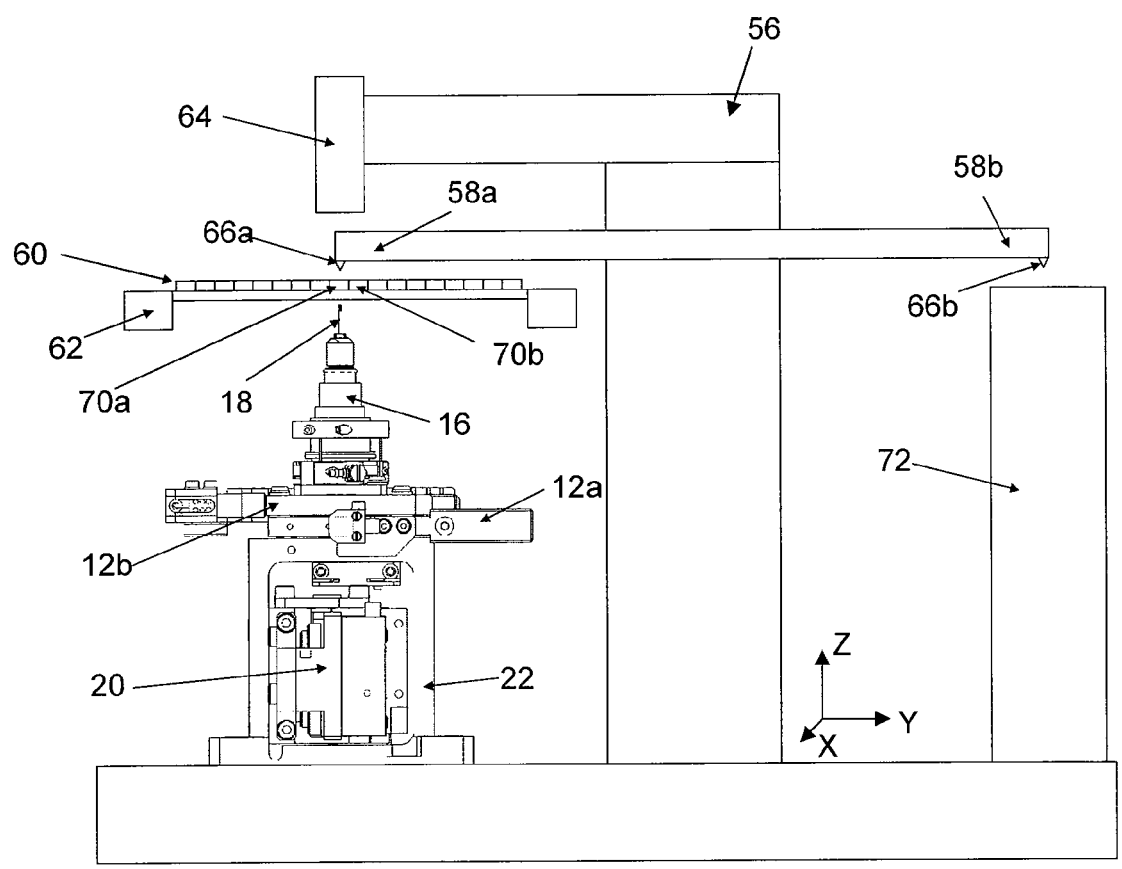
FIG. 5 is a side view of a bonding apparatus having dual bond arms for picking up semiconductor dice that are detached by the die detachment apparatus of FIG. 1.

FIG. 5 is a side view of a bonding apparatus 56 having dual bond arms 58a, 58b for picking up semiconductor dice that are detached by the die detachment apparatus 10 of FIG. 1. The die detachment apparatus 10 is first calibrated before operation. During calibration, a first bond arm 58a is rotated to a pick-up position above a die of a wafer 60 which is supported on a wafer table 62 located below a camera 64. The camera 64 records the position of a first collet 66a mounted to one end of the first bond arm 58a. A second bond arm 58b is next rotated to the pick-up position where the position of a second collet 66b on the second bond arm 58b is recorded by the camera 64. The positional offset between the first collet 66a and second collet 66b at the pick-up position is calculated and registered.

During a pick-and-place process, the first bond arm 58a is rotated to the pick-up position above the wafer 60 to pick up a first die 70a. Both the first and second flexural stages 12a, 12b remain fixed in position so that the die ejector 16 is stationary in the XY directions when the ejector pin 18 is aligned with the first collet 66a. Next, the first bond arm 58a picks up the die 70a and moves the die 70a away. The second bond arm 58b is simultaneously rotated to the pick-up position while the wafer table 62 moves to a position which compensates for the positional error measured by the camera for a second die 70b to be picked up precisely. The first and second flexural stages 12a, 12b are activated and move the ejector 16 to correct the positional error detected by the camera 64 so that the second bond arm collet 66b, the second die 70b on the wafer table 62, and the ejector pin 18 are collinear. The first die 70a on the first bond arm 58a is placed on a tray or bonded onto a substrate 72 while the second bond arm 58b picks up the second die 70b from amongst the wafer 60. Thereafter, the first and second flexural stages 12a, 12b return to their original positions and the cycle is repeated for the remaining dice.

It should be appreciated that the preferred embodiment of the invention described above enables the ejector pin 18 to be adjusted with very small offsets so that alignment of the ejector pin 18 to either the first collet 66a on the first bond arm 58a or the second collet 66b on the second bond arm 58b can be achieved in a pick-and-place apparatus with multiple bond arms 58a, 58b. The alignment is also attainable quickly within a time-frame of 20 ms for a range of pick-up position offsets to about 150 μm, when the movable table 40 is moved through the said distance relative to the second stationary frame 44.

The invention described herein is susceptible to variations, modifications and/or additions other than those specifically described and it is to be understood that the invention includes all such variations, modifications and/or additions which fall within the spirit and scope of the above description.

The invention claimed is:

1. A die ejector for a die detachment apparatus for detaching a die from an adhesive tape on which the die is mounted, the die detachment apparatus including a pick-and-place tool movable along a pick-up axis for picking up the die from the adhesive tape, the die ejector comprising:
an ejector shaft including an ejector pin which is movable parallel to the pick-up axis to raise the die from the adhesive tape on which the die is mounted to facilitate pick-up of the die from the adhesive tape by the pick-and-place tool;
a positioning device having at least one movable table to which the ejector shaft is operatively coupled, the positioning device further comprising at least one piezoelectric actuator; and
at least one flexure connecting the piezoelectric actuator and the movable table, the flexure being operatively responsive to actuation by the piezoelectric actuator to force the movable table and ejector shaft to move in directions which are perpendicular to the pick-up axis for alignment of the ejector pin with the die pick-up tool along the pick-up axis.

2. The die ejector as claimed in claim 1, wherein the positioning device comprises a first movable table that is operative to move along a first axis perpendicular to the pick-up axis and a second movable table located adjacent to the first movable table that is operative to move along a second axis which is perpendicular to the first axis and the pick-up axis, the ejector shaft being operatively coupled to both the first and second movable tables.

3. The die ejector as claimed in claim 2, further comprising a common support frame to which the first and second movable tables are mounted.

4. The die ejector as claimed in claim 1, further comprising an ejection actuator which is operative to control movement of the ejector pin in directions parallel to the pick-up axis, and which is decoupled from the positioning device such that it does not move the ejector pin in directions which are perpendicular to the pick-up axis.

5. The die ejector as claimed in claim 1, wherein the positioning device has an amplification region comprising the piezoelectric actuator, a flexural guide region comprising the movable table and a beam linking the amplification region and the flexural guide region.

6. The die ejector as claimed in claim 5, wherein the piezoelectric actuator comprises a piezoelectric stack and the amplification region further comprises a first stationary frame and a lever.

7. The die ejector as claimed in claim 6, wherein the lever is connected to the piezoelectric stack via an input flexure, to the stationary frame via a pivot flexure and to the movable table via the beam, and wherein a distance from the input flexure to the pivot flexure is less than a distance from the beam to the pivot flexure.

8. The die ejector as claimed in claim 7, wherein the input flexure is located between the pivot flexure and the beam.

9. The die ejector as claimed in claim 6, wherein the first stationary frame is an L-shaped structure, and the piezoelectric stack is arranged parallel to a longer side of the L-shaped structure whereas the lever is orthogonal to the longer side of the L-shaped structure.

10. The die ejector as claimed in claim 9, wherein one end of the piezoelectric stack is connected to a shorter side of the L-shaped structure and another end of the piezoelectric stack is connected to the lever.

11. The die ejector as claimed in claim 6, wherein the movable table at the flexural guide region is surrounded by a second stationary frame having a hollow center where the movable table is located.

12. The die ejector as claimed in claim 11, further comprising multiple flexural guides connecting the movable table to multiple points on the second stationary frame.

13. The die ejector as claimed in claim 12, wherein the multiple flexural guides are arranged in a symmetrical fashion around the movable table.

14. The die ejector as claimed in claim 12, wherein each flexural guide comprises a pair of thin parallel beams with one end of each parallel beam connected to the other parallel beam.

15. The die ejector as claimed in claim 11, further comprising a displacement sensor operative to provide feedback on the position of the movable table relative to the first and second stationary frames.

16. The die ejector as claimed in claim 15, wherein the displacement sensor comprises excitable electrical coils mounted to either one of the first stationary frame and the movable table, and a magnetic rod mounted to the other of the first stationary frame and the movable table.

17. A die detachment apparatus for detaching a die from an adhesive tape on which the die is mounted, comprising:
- a pick-and-place tool movable along a pick-up axis for picking up the die from the adhesive tape;
- an ejector shaft including an ejector pin which is movable parallel to the pick-up axis to raise the die from the adhesive tape on which the die is mounted to facilitate pick-up of the die from the adhesive tape by the pick-and-place tool;
- a positioning device having at least one movable table to which the ejector shaft is operatively coupled, the positioning device further comprising at least one piezoelectric actuator; and
- at least one flexure connecting the piezoelectric actuator and the movable table, the flexure being operatively responsive to actuation by the piezoelectric actuator to force the movable table and ejector shaft to move in directions which are perpendicular to the pick-up axis for alignment of the ejector pin with the die pick-up tool along the pick-up axis.

* * * * *